United States Patent
Hasan Taufique et al.

(10) Patent No.: US 9,496,026 B1
(45) Date of Patent: Nov. 15, 2016

(54) MEMORY DEVICE WITH STABLE WRITING AND/OR READING OPERATION

(71) Applicant: TAIWAN SEMICONDUCTOR MANUFACTURING CO., LTD., Hsinchu (TW)

(72) Inventors: Mohammed Hasan Taufique, Hsinchu (TW); Hidehiro Fujiwara, Hsin-chu (TW); Hung-Jen Liao, Hsin-Chu (TW); Yen-Huei Chen, Jhudong Township (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 14/700,135

(22) Filed: Apr. 29, 2015

(51) Int. Cl.
| G11C 11/00 | (2006.01) |
| G11C 11/419 | (2006.01) |
| G11C 7/12 | (2006.01) |
| G11C 11/412 | (2006.01) |
| G11C 7/22 | (2006.01) |

(52) U.S. Cl.
CPC .............. G11C 11/419 (2013.01); G11C 7/12 (2013.01); G11C 7/22 (2013.01); G11C 11/412 (2013.01)

(58) Field of Classification Search
CPC ..... G11C 11/419; G11C 11/412; G11C 7/12; G11C 5/14; G11C 7/00; G11C 7/065; G11C 7/106; G11C 2207/2227; G11C 7/1045
USPC ............... 365/154, 156, 189.01, 203, 230.06
See application file for complete search history.

(56) References Cited

U.S. PATENT DOCUMENTS

| 5,414,657 | A | * | 5/1995 | Okimura | G11C 8/16 365/149 |
| 5,571,038 | A | * | 11/1996 | Halling | A63H 27/00 434/32 |
| 8,585,992 | B2 | * | 11/2013 | Wang | C01F 7/148 210/710 |
| 2015/0043270 | A1 | * | 2/2015 | Singh | G11C 11/416 365/154 |
| 2016/0005458 | A1 | * | 1/2016 | Shu | G11C 5/063 365/156 |
| 2016/0042785 | A1 | * | 2/2016 | Rim | G11C 11/418 365/156 |

OTHER PUBLICATIONS

Chang, L., et al., "An 8T-SRAM for Variability Tolerance and Low-Voltage Operation in High-Performance Caches", IEEE Journal of Solid-State Circuits, vol. 43, Issue 4, Apr. 2008, pp. 956-963.
Hentrich, D., et al., "Performance Evaluation of SRAM Cells in 22nm Predictive CMOS Techonology", IEEE International Conference on Electro/Information Technology, Jun. 2009, pp. 470-475.
Kuriyama, H., et al., "A C-Switch Cell for Low-Voltage and High-Density SRAM's", IEEE Transactions on Electron Devices, vol. 45, Issue 12, Dec. 1998, pp. 2483-2488.

* cited by examiner

Primary Examiner — Gene Auduong
(74) Attorney, Agent, or Firm — Maschoff Brennan

(57) ABSTRACT

A memory device includes a first inverter, a second inverter cross-coupled with the first inverter, an accessing unit, and a switching unit. The accessing unit is configured to discharge an output of the first inverter and charge an output of the second inverter according to signals provided by a first word line and a second word line. The switching unit is configured to disconnect a power from the first inverter and the second inverter according to a signal provided by the first word line.

20 Claims, 9 Drawing Sheets

THE ACCESSING UNIT 110 DISCHARGES THE NODE S1 AND CHARGES THE NODE S2 ACCORDING TO SIGNALS PROVIDED BY THE WORD LINE WWL AND THE WORD LINE WWLB, DURING A WRITING OPERATION
210

THE SWITCHING UNIT 120 IS CONFIGURED TO DISCONNECT THE POWER VOLTAGE VDD FROM THE FIRST TERMINAL OF THE PMOS TRANSISTOR P1 AND THE FIRST TERMINAL OF THE PMOS TRANSISTOR P2 ACCORDING TO A SIGNAL PROVIDED BY THE WORD LINE WWL, DURING THE WRITING OPERATION
220

THE SWITCHING UNIT 120 IS CONFIGURED TO CONNECT THE POWER VOLTAGE VDD TO THE FIRST TERMINAL OF THE PMOS TRANSISTOR P1 AND THE FIRST TERMINAL OF THE PMOS TRANSISTOR P2 ACCORDING TO A SIGNAL PROVIDED BY THE WORD LINE WWL, DURING A READING OPERATION
230

THE READING UNIT 130 IS CONFIGURED TO DISCHARGE THE BIT LINE RBL ACCORDING TO A SIGNAL PROVIDED BY THE WORD LINE RWL AND THE NODE S1, DURING THE READING OPERATION
240

DURING A WRITING OPERATION, THE CMOS TRANSMISSION GATE 112 IS CONFIGURED TO BE CONTROLLED WITH THE SIGNALS PROVIDED BY THE WORD LINE WWL AND THE WORD LINE WWLB, TO DISCHARGE THE NODE S1 IN RESPONSE TO A SIGNAL PROVIDED BY THE BIT LINE WBL.
410

DURING THE WRITING OPERATION, THE CMOS TRANSMISSION GATE 114 IS CONFIGURED TO BE CONTROLLED WITH THE SIGNALS PROVIDED BY THE WORD LINE WWL AND THE WORD LINE WWLB, TO CHARGE THE NODE S2 IN RESPONSE TO A SIGNAL PROVIDED BY THE BIT LINE WBLB.
420

DURING THE WRITING OPERATION, THE TRANSISTOR P5 IS CONFIGURED TO BE CONTROLLED WITH THE SIGNAL PROVIDED BY THE WORD LINE WWL, TO DISCONNECT THE POWER VOLTAGE VDD FROM THE CMOS INVERTER C1.
430

DURING THE WRITING OPERATION, THE TRANSISTOR P6 IS CONFIGURED TO BE CONTROLLED WITH THE SIGNAL PROVIDED BY THE WORD LINE WWL, TO DISCONNECT THE POWER VOLTAGE VDD FROM THE CMOS INVERTER C2.
440

DURING A READING OPERATION, THE TRANSISTOR N5 IS TURNED ON ACCORDING TO THE SIGNAL PROVIDED BY THE WORD LINE RWL, AND THE TRANSISTOR N6 IS TURNED ON ACCORDING TO THE SIGNAL STORED IN THE NODE S1 FOR DISCHARGING THE BIT LINE RBL.
450

```
┌─────────────────────────────────────────────────────────────┐
│   DURING A WRITING OPERATION, THE SWITCHING UNIT 510 IS     │
│   CONFIGURED TO DISCHARGE THE NODE S2 OF THE CMOS           │
│   INVERTER C2 IN RESPONSE TO A SIGNAL PROVIDED BY THE BIT   │
│   LINE BLB THROUGH THE TRANSISTOR N4, AND CHARGE THE        │
│   NODE S1 IN RESPONSE TO A SIGNAL PROVIDED BY THE           │
│   BIT LINE BL THROUGH THE TRANSISTOR N3                     │
│                          610                                │
└─────────────────────────────────────────────────────────────┘
                              │
                              ▼
┌─────────────────────────────────────────────────────────────┐
│   DURING THE WRITING OPERATION, THE SWITCHING UNIT 520 IS   │
│   CONFIGURED TO DISCONNECT THE POWER VOLTAGE VDD FROM       │
│   THE CMOS INVERTER C2 ACCORDING TO A SIGNAL PROVIDED       │
│   BY THE DATA LINE D.                                       │
│                          620                                │
└─────────────────────────────────────────────────────────────┘
                              │
                              ▼
┌─────────────────────────────────────────────────────────────┐
│   DURING A READING OPERATION, THE SWITCHING UNIT 530 IS     │
│   CONFIGURED TO CONNECT THE TRANSISTOR N3 TO THE            │
│   REFERENCE VOLTAGE ACCORDING TO THE SIGNAL PROVIDED        │
│   BY THE NODE S2                                            │
│                          630                                │
└─────────────────────────────────────────────────────────────┘
```

DURING A WRITING PERIOD, THE TRANSISTOR N6 IS CONFIGURED TO BE CONTROLLED WITH A SIGNAL PROVIDED BY THE SELECTING LINE SEL, TO CONNECT THE TRANSISTOR N4 WITH THE NODE S2 AND DISCHARGE THE NODE S2 IN RESPONSE TO THE SIGNAL PROVIDED BY THE BIT LINE BLB THROUGH THE TRANSISTOR N4
810

DURING THE WRITING PERIOD, THE TRANSISTOR N5 IS CONFIGURED TO BE CONTROLLED WITH THE SIGNAL PROVIDED BY THE SELECTING LINE SEL, TO CONNECT THE TRANSISTOR N3 WITH THE NODE S1 AND CHARGE THE NODE S1 IN RESPONSE TO THE SIGNAL PROVIDED BY THE BIT LINE BL THROUGH THE TRANSISTOR N3
820

DURING THE WRITING PERIOD, THE TRANSISTOR P4 IS CONFIGURED TO BE CONTROLLED WITH THE SIGNAL PROVIDED BY THE DATA LINE D, TO DISCONNECT THE POWER VOLTAGE VDD FROM THE CMOS INVERTER C2
830

DURING A READING PERIOD, THE TRANSISTOR N5 IS TURNED OFF ACCORDING TO THE SIGNAL PROVIDED BY THE SELECTING LINE SEL FOR DISCONNECTING THE SECOND TERMINAL OF THE TRANSISTOR N3 AND THE NODE S1, AND THE TRANSISTOR N7 IS TURNED ON ACCORDING TO THE SIGNAL PROVIDED THE NODE S2 FOR DISCHARGING THE BIT LINE BL
840

MEMORY DEVICE WITH STABLE WRITING AND/OR READING OPERATION

BACKGROUND

Static random access memory (SRAM) is a kind of memory which uses bistable latching circuit for storing each bit. The term "static" random access memory is different from "dynamic" random access memory (DRAM) which must be periodically refreshed. SRAM exhibits data remanence, but it is still volatile in the conventional sense that data is eventually lost when the memory is not powered.

However, due to capability difference among transistors of SRAM, a writing operation of SRAM may fail. On the other hand, due to a bias generated among transistors of SRAM thereby making one of memory cells in SRAM flip, a reading operation of SRAM may fail.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flow diagram of a method for controlling the SRAM as illustrated in FIG. 1 in accordance with some embodiments.

FIG. 4 is a flow diagram of a method for controlling the SRAM as illustrated in FIG. 3 in accordance with some embodiments.

FIG. 6 is a flow diagram of a method for controlling the SRAM as illustrated in FIG. 5 in accordance with some embodiments.

FIG. 8 is a flow diagram of a method for controlling the SRAM as illustrated in FIG. 7 in accordance with some embodiments.

DETAILED DESCRIPTION

Figure 1:
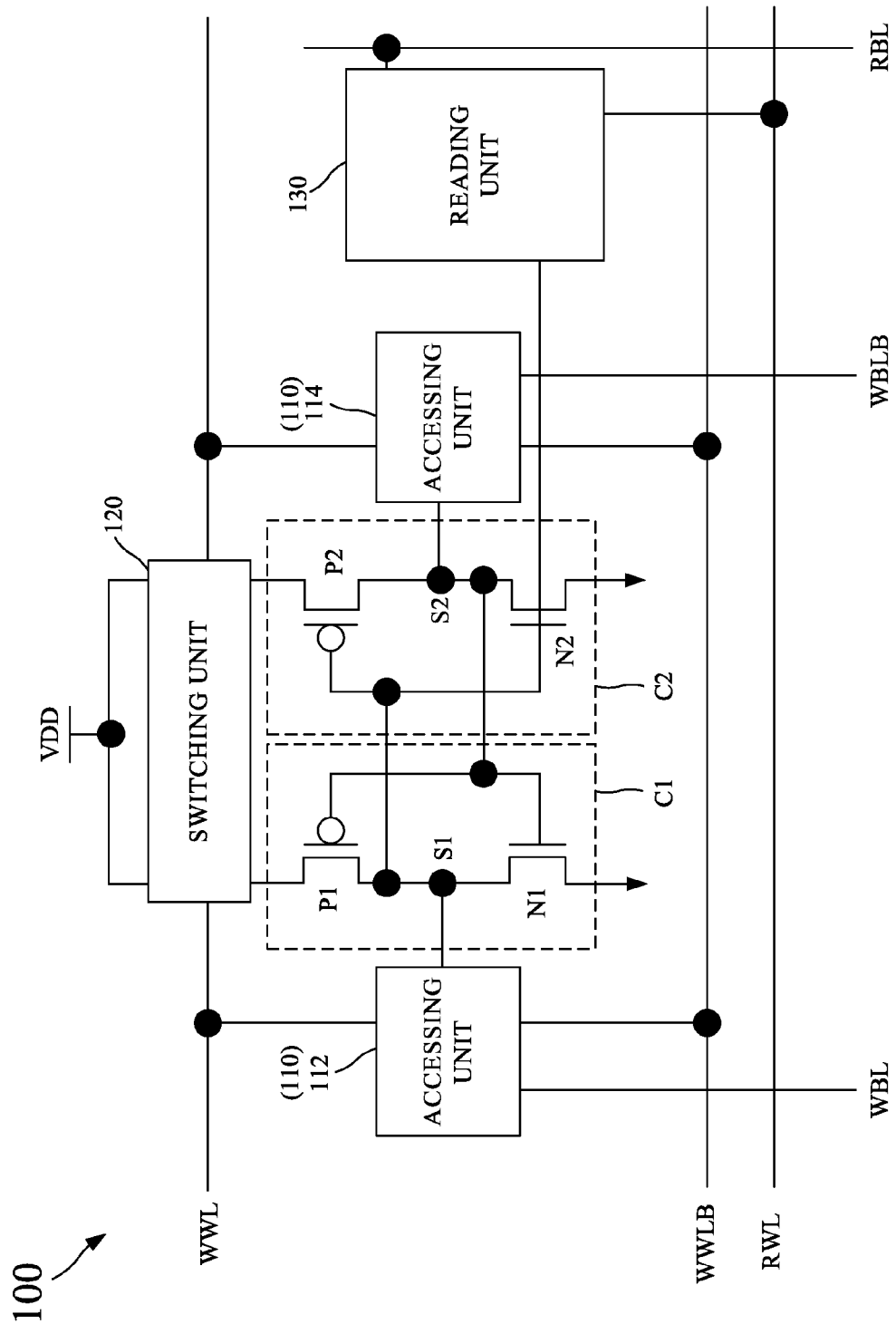
FIG. 1 is a schematic diagram of a static random access memory (SRAM) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

FIG. 1 is a schematic diagram of a static random access memory (SRAM) in accordance with some embodiments.

As illustratively shown in FIG. 1, the SRAM 100 includes a complementary metal oxide semiconductor (CMOS) inverter C1, a CMOS inverter C2, an accessing unit 110, and a switching unit 120. The CMOS inverter C1 includes a p-type metal oxide semiconductor (PMOS) transistor P1 and a N-type metal oxide semiconductor (NMOS) transistor N1. Each of the PMOS transistor P1 and the NMOS transistor N1 includes a first terminal, a second terminal, and a control terminal. The second terminal of the PMOS transistor P1 is coupled to the first terminal of the NMOS transistor N1 at a node S1 which indicates an output of the CMOS inverter C1.

In addition, the CMOS inverter C2 includes a PMOS transistor P2 and a NMOS transistor N2. Each of the PMOS transistor P2 and the NMOS transistor N2 includes a first terminal, a second terminal, and a control terminal. The second terminal of the PMOS transistor P2 is coupled to the first terminal of the NMOS transistor N2 at a node S2 which indicates an output of the CMOS inverter C2. The CMOS inverter C2 is cross-coupled with the CMOS inverter C1. The accessing unit 110 is coupled to a word line WWL, a word line WWLB, the node S1, and the node S2. The switching unit 120 is coupled to a power voltage VDD, the word line WWL, the first terminal of the PMOS transistor P1, and the first terminal of the PMOS transistor P2.

In some embodiments, the SRAM 100 further includes a reading unit 130. The reading unit 130 is coupled to a word line RWL, a bit line RBL, and the output of the CMOS inverter C1.

FIG. 2 is a flow diagram of a method for controlling the SRAM as illustrated in FIG. 1 in accordance with some embodiments. For illustration, the operations of the SRAM 100 in FIG. 1 are described with reference to the method 200.

In operation 210, the accessing unit 110 discharges the node S1 and charges the node S2 according to signals provided by the word line WWL and the word line WWLB, during a writing operation. Hereinafter, the accessing unit 110 charging the node S2 indicates that the voltage at the node S2 is successfully pulled up through the accessing unit 110 to the voltage (e.g., the power voltage VDD) on a bit line WBLB. As a result, a write recovery failure during the writing operation is prevented.

In operation 220, the switching unit 120 is configured to disconnect the power voltage VDD from the first terminal of the PMOS transistor P1 and the first terminal of the PMOS transistor P2 according to a signal provided by the word line WWL, during the writing operation. Since the power voltage VDD is disconnected from the first terminal of the PMOS transistor P1 and the first terminal of the PMOS transistor P2, the power voltage VDD does not affect the node S1 through the PMOS transistor P1. Accordingly, the switching unit 120 prevents a write failure.

In operation 230, the switching unit 120 is configured to connect the power voltage VDD to the first terminal of the PMOS transistor P1 and the first terminal of the PMOS transistor P2 according to a signal provided by the word line WWL, during a reading operation.

In operation 240, the reading unit 130 is configured to discharge the bit line RBL according to a signal provided by the word line RWL and the node S1, during the reading operation. Hereinafter, the reading unit 130 discharging the bit line RBL indicates that the voltage of the bit line RBL is successfully pulled down through the reading unit 130 to ground. Since the reading unit 130 is operated as an independent read port, the reading operation is executed independently and will not be affected by other part of the SRAM 100. Therefore, the signal provided by the bit line RBL is detected by a sense amplifier (not shown), and a read disturbance issue is prevented.

In other approaches, during a write "0" operation, the accessing unit 110 discharges the node S1; meanwhile, the PMOS transistor P1 is turned on, and the power voltage VDD affects the node S1 through the PMOS transistor P1, which will cause a write connection failure. On the other hand, if the PMOS transistor P2 is too weak, the node S2 is not successfully pulled up to the power voltage VDD, which will cause a write recovery failure. During the read operation, the accessing unit 110 discharges the bit line WBL through the node S1 and the NMOS transistor N1 to ground, and the voltage stored in the node S1 raise up to ΔV. The voltage ΔV stored in the node S1 causes the CMOS inverter C2 flip and lead to a read disturbance issue.

Compared to the approaches described above, the voltage at the node S2 is successfully pulled up through the accessing unit 110 to the power voltage VDD as described in the method of FIG. 2. As a result, the write recovery failure during the writing operation is prevented. On the other hand, the switching unit 120 disconnects the power voltage VDD from the first terminal of the PMOS transistor P1 during the writing operation as described in the method of FIG. 2; and therefore, the power voltage VDD does not affect the node S1 through the PMOS transistor P1. Accordingly, the switching unit 120 prevents the write connection failure. In addition, since the reading unit 130 is operated as an independent read port, the read disturbance issue is prevented.

Figure 3:
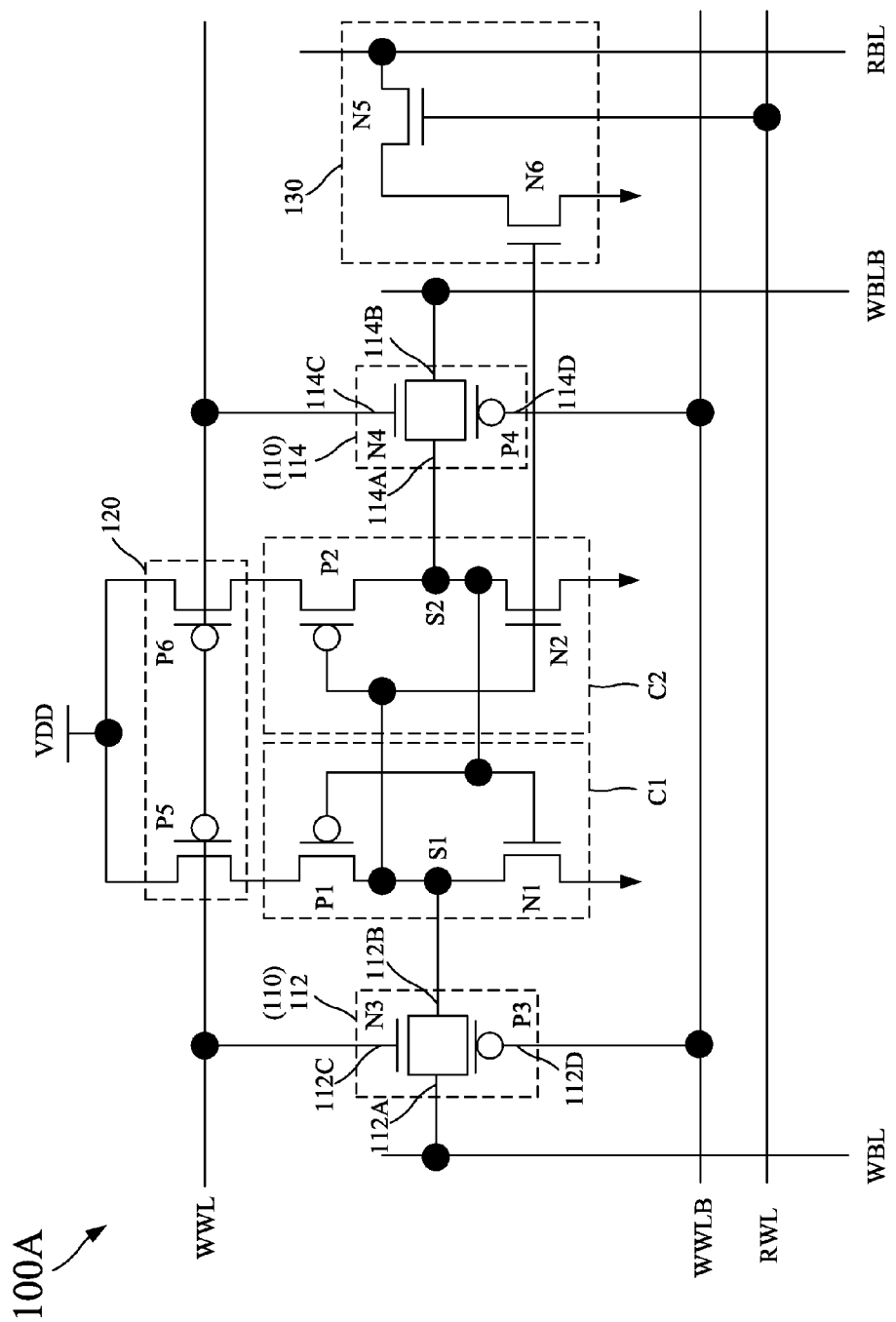
FIG. 3 is a schematic diagram of the SRAM as illustrated in FIG. 1 in accordance with some embodiments.

FIG. 3 is a schematic diagram of the SRAM as illustrated in FIG. 1 in accordance with some embodiments. As illustratively shown in FIG. 3, the accessing unit 110 includes a CMOS transmission gate 112 and a CMOS transmission gate 114. The CMOS transmission gate 112 includes an input 112A, an output 112B, a control terminal 112C, and a control terminal 112D. The input 112A is coupled to a bit line WBL, the output 112B is coupled to the node S1, the control terminal 112C is coupled to the word line WWL, and the control terminal 112D is coupled to the word line WWLB. The CMOS transmission gate 114 includes an input 114A, an output 114B, a control terminal 114C, and a control terminal 114D. The input 114A is coupled to the node S2, the output 114B is coupled to a bit line WBLB, the control terminal 114C is coupled to the word line WWL, and the control terminal 114D is coupled to the word line WWLB.

In some embodiments, the switching unit 120 includes a transistor P5 and a transistor P6. Each of the transistors P5, P6 includes a first terminal, a second terminal, and a control terminal. The first terminal of the transistor P5 is coupled to the power voltage VDD. The second terminal of the transistor P5 is coupled to the first terminal of the PMOS transistor P1. The control terminal of the transistor P5 is coupled to the word line WWL and the CMOS transmission gate 112 of the accessing unit 110. The first terminal of the transistor P6 is coupled to the power voltage VDD. The second terminal of the transistor P6 is coupled to the first terminal of the PMOS transistor P2. The control terminal of the transistor P6 is coupled to the word line WWL and the CMOS transmission gate 114 of the accessing unit 110.

In some embodiments, the reading unit 130 includes a transistor N5 and a transistor N6. Each of the transistors N5, N6 includes a first terminal, a second terminal, and a control terminal. The second terminal of the transistor N5 is coupled to the bit line RBL. The control terminal of the transistor N5 is coupled to the word line RWL. The first terminal of the transistor N6 is coupled to the first terminal of the transistor N5. The second terminal of the transistor N6 is coupled to ground. The control terminal of the transistor N6 is coupled to the node S1.

In some embodiments, the control terminal of the PMOS transistor P1 is coupled to the control terminal of the NMOS transistor N1. The control terminal of the PMOS transistor P2 is coupled to the control terminal of the NMOS transistor N2. The node S1 is coupled to the control terminals of the PMOS transistor P2 and the second NMOS transistor N2. The node S2 is coupled to the control terminals of the PMOS transistor P1 and the NMOS transistor N1.

FIG. 4 is a flow diagram of a method for controlling the SRAM as illustrated in FIG. 3 in accordance with some embodiments. For illustration, the operations of the SRAM 100A in FIG. 3 are described with reference to the method 400.

In operation 410, during a writing operation, the CMOS transmission gate 112 is configured to be controlled with the signals provided by the word line WWL and the word line WWLB, to discharge the node S1 in response to a signal provided by the bit line WBL. Hereinafter, the CMOS transmission gate 112 discharging the node S1 indicates that the voltage at the node S1 is successfully pulled down through the CMOS transmission gate 112 to the voltage (e.g., a reference voltage) on the bit line WBL. In some embodiments, the signals provided by the word line WWL and the word line WWLB are opposite.

In operation 420, during the writing operation, the CMOS transmission gate 114 is configured to be controlled with the signals provided by the word line WWL and the word line WWLB, to charge the node S2 in response to a signal provided by the bit line WBLB. Hereinafter, the CMOS transmission gate 114 charging the node S2 indicates that the voltage at the node S2 is successfully pulled up through the CMOS transmission gate 114 to the voltage (e.g., a power voltage VDD) on the bit line WBLB. Since the node S2 is charged by the bit line WBLB through the CMOS transmission gate 114, the voltage stored in the node S2 is successfully pulled up to the power voltage VDD so as to prevent the write recovery failure.

In operation 430, during the writing operation, the transistor P5 is configured to be controlled with the signal provided by the word line WWL, to disconnect the power voltage VDD from the CMOS inverter C1. Since the power voltage VDD is disconnected from and the CMOS inverter C1, a current path between the PMOS transistor P1 and the CMOS transmission gate 112 is disconnected so as to prevent the write connection failure.

In operation 440, during the writing operation, the transistor P6 is configured to be controlled with the signal provided by the word line WWL, to disconnect the power voltage VDD from the CMOS inverter C2.

In operation 450, during a reading operation, the transistor N5 is turned on according to the signal provided by the word line RWL, and the transistor N6 is turned on according to the signal stored in the node S1 for discharging the bit line RBL. The transistors N5, N6 discharging the bit line RBL indicates that the voltage of the bit line RBL is successfully pulled down through the transistors N5, N6 to ground. Since the reading unit 130 including the transistors N5, N6 is operated as an independent read port, the reading operation can be executed independently and will not be affected by other part of the SRAM 100A. Therefore, the read disturbance issue during the reading operation can be prevented.

Compared to the approaches described above, the voltage at the node S2 is successfully pulled up through the CMOS transmission gate 114 to the power voltage VDD as described in the method of FIG. 4. As a result, the write recovery failure during the writing operation is prevented. On the other hand, the transistor P5 disconnects the power voltage VDD from the first terminal of the PMOS transistor P1 during the writing operation as described in the method of FIG. 4; and therefore, the power voltage VDD does not affect the node S1 through the PMOS transistor P1. Accordingly, the transistor P5 prevents the write connection failure. In addition, since the reading unit 130 including the transistors N5, N6 is operated as an independent read port, the read disturbance issue is prevented.

Figure 5:
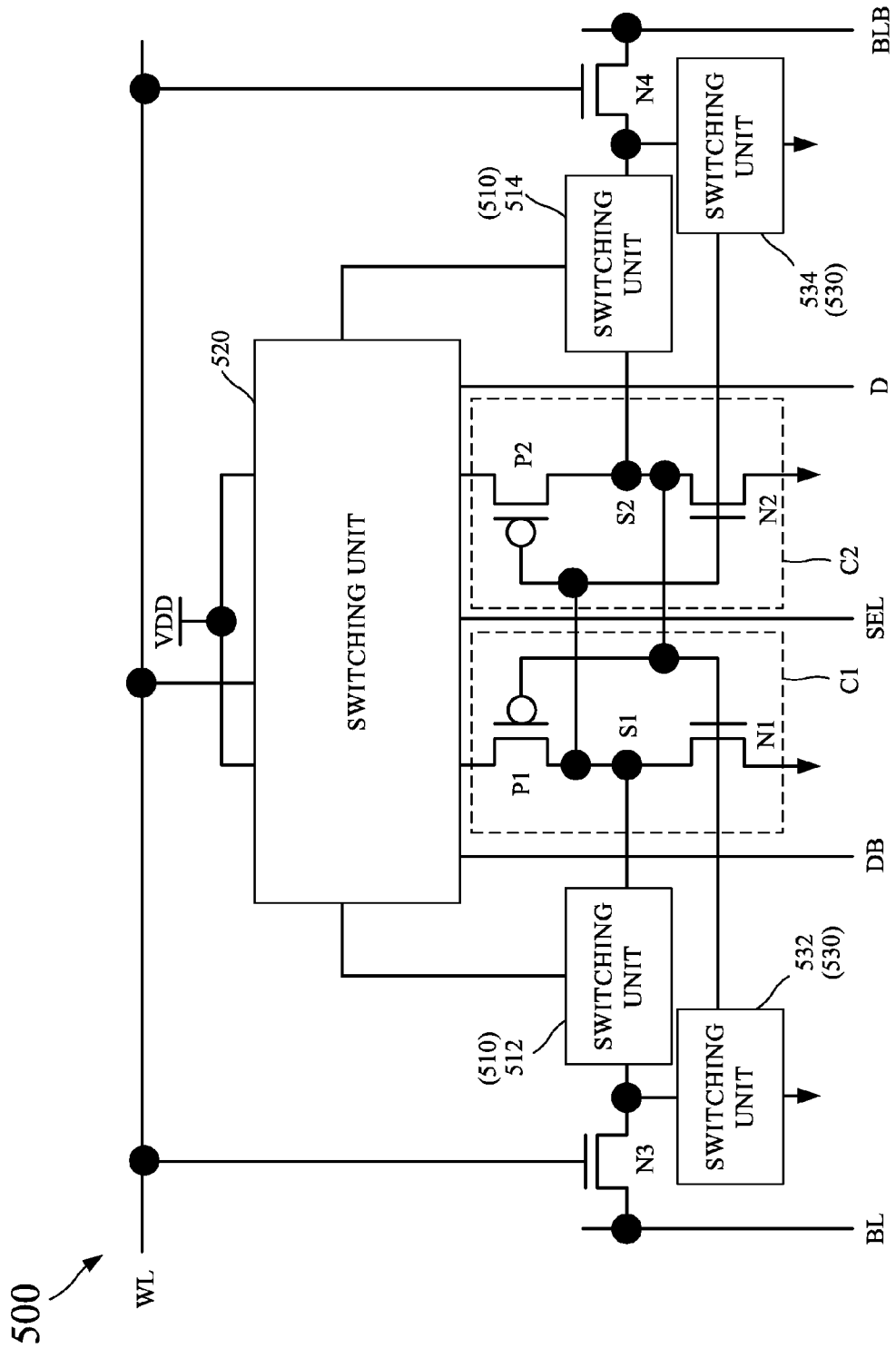
FIG. 5 is a schematic diagram of a SRAM in accordance with some embodiments.

FIG. 5 is a schematic diagram of a SRAM in accordance with some embodiments. As illustratively shown in FIG. 5, the SRAM 500 includes a CMOS inverter C1, a CMOS inverter C2, a transistor N3, a transistor N4, a switching unit 510, a switching unit 520, and a switching unit 530. The CMOS inverter C1 includes a PMOS transistor P1 and a NMOS transistor N1. Each of the PMOS transistor P1 and the NMOS transistor N1 includes a first terminal, a second terminal, and a control terminal. The second terminal of the PMOS transistor P1 is coupled to the first terminal of the NMOS transistor N1 at a node S1 which indicates an output of the CMOS inverter C1. The CMOS inverter C2 is cross-coupled with the CMOS inverter C1.

In addition, the CMOS inverter C2 includes a PMOS transistor P2 and a NMOS transistor N2. Each of the PMOS transistor P2 and the NMOS transistor N2 includes a first terminal, a second terminal, and a control terminal. The second terminal of the PMOS transistor P2 is coupled to the first terminal of the NMOS transistor N2 at a node S2 which indicates an output of the CMOS inverter C2. Each of the transistors N3, N4 includes a first terminal, a second terminal, and a control terminal. The first terminal of the transistor N3 is coupled to a bit line BL. The control terminal of the transistor N3 is coupled to a word line WL. The second terminal of the transistor N4 is coupled to a bit line BLB. The control terminal of the transistor N4 is coupled to the word line WL.

Besides, the switching unit 510 is coupled to the second terminal of the transistor N3, the first terminal of the transistor N4, the node S1, the node S2, and a selecting line SEL. The switching unit 520 is coupled to a power voltage VDD, the first terminals of the PMOS transistor P1 and the PMOS transistor P2, and data lines D, DB. The switching unit 530 is coupled to the second terminal of the transistor N3, the node S1, and the node S2.

FIG. 6 is a flow diagram of a method for controlling the SRAM as illustrated in FIG. 5 in accordance with some embodiments. For illustration, the operations of the SRAM 500 in FIG. 5 are described with reference to the method 600.

In operation 610, during a writing operation, the switching unit 510 is configured to discharge the node S2 of the CMOS inverter C2 in response to a signal provided by the bit line BLB through the transistor N4, and charge the node S1 in response to a signal provided by the bit line BL through the transistor N3. Hereinafter, the switching unit 510 charging the node S1 indicates that the voltage at the node S1 is successfully pulled up through the switching unit 510 to the voltage (e.g., the power voltage VDD) on the bit line BL. As a result, the write recovery failure during the writing operation is prevented.

In operation 620, during the writing operation, the switching unit 520 is configured to disconnect the power voltage VDD from the CMOS inverter C2 according to a signal provided by the data line D. Since the power voltage VDD is disconnected from the CMOS inverter C2, the power voltage VDD does not affect the node S2 through the PMOS transistor P2. Accordingly, the switching unit 520 prevents the write failure.

In operation 630, during a reading operation, the switching unit 530 is configured to connect the transistor N3 to the reference voltage (e.g., ground) according to the signal provided by the node S2.

Figure 7:
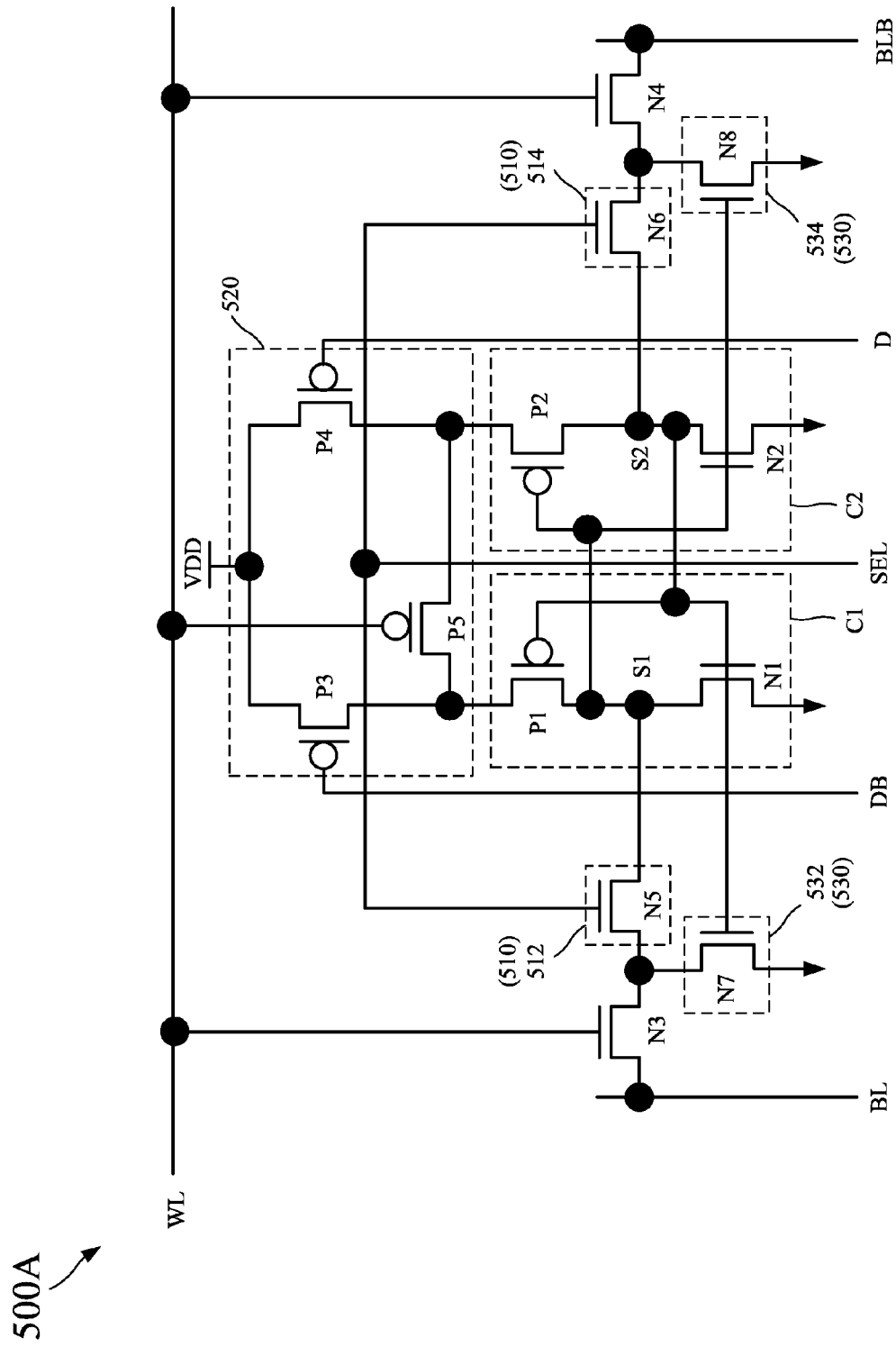
FIG. 7 is a schematic diagram of the SRAM as illustrated in FIG. 5 in accordance with some embodiments.

FIG. 7 is a schematic diagram of the SRAM as illustrated in FIG. 5 in accordance with some embodiments. As illustratively shown in FIG. 7, the switching unit 510 includes a transistor N5 and a transistor N6. Each of the transistors N5, N6 includes a first terminal, a second terminal, and a control terminal. The first terminal of the transistor N5 is coupled to the second terminal of the transistor N3. The second terminal of the transistor N5 is coupled to the node S1. The control terminal of the transistor N5 is coupled to the selecting line SEL. The first terminal of the transistor N6 is coupled to the node S2. The second terminal of the transistor N6 is coupled to the first terminal of the transistor N4. The control terminal of the transistor N6 is coupled to the selecting line SEL.

In some embodiments, the switching unit 530 includes a transistor N7 and a transistor N8. Each of the transistors N7, N8 includes a first terminal, a second terminal, and a control terminal. The first terminal of the transistor N7 is coupled to the second terminal of the transistor N3. The second terminal of the transistor N7 is coupled to ground. The control terminal of the transistor N7 is coupled to the node S2. The first terminal of the transistor N8 is coupled to the first terminal of the transistor N4. The second terminal of the transistor N8 is coupled to ground. The control terminal of the transistor N8 is coupled to the node S1.

In some embodiments, the switching unit 520 includes a transistor P3 and a transistor P4. Each of the transistors P3, P4 includes a first terminal, a second terminal, and a control terminal. The first terminals of the transistors P3, P4 are coupled to the power voltage VDD. The second terminal of the transistor P3 is coupled to the first terminal of the PMOS transistor P1. The control terminal of the transistor P3 is coupled to a data line DB. The second terminal of the transistor P4 is coupled to the first terminal of the PMOS transistor P2. The control terminal of the transistor P4 is coupled to a second data line D.

In some embodiments, the switching unit 520 further includes a transistor P5 which is operated as an equalizer. The transistor P5 is coupled to the first terminals of the PMOS transistor P1 and the PMOS transistor P2.

FIG. 8 is a flow diagram of a method for controlling the SRAM as illustrated in FIG. 7 in accordance with some embodiments. For illustration, the operations of the SRAM 500A in FIG. 7 are described with reference to the method 800.

In operation 810, during a writing period, the transistor N6 is configured to be controlled with a signal provided by the selecting line SEL, to connect the transistor N4 with the node S2 and discharge the node S2 in response to the signal provided by the bit line BLB through the transistor N4. Hereinafter, the transistor N6 discharging the node S2 indicates that the voltage of the node S2 is successfully pulled down through the transistor N6 to ground.

In operation 820, during the writing period, the transistor N5 is configured to be controlled with the signal provided by the selecting line SEL, to connect the transistor N3 with the node S1 and charge the node S1 in response to the signal provided by the bit line BL through the transistor N3. Hereinafter, the transistor N5 charging the node S1 indicates that the voltage at the node S1 is successfully pulled up through the transistor N5 to the voltage (e.g., the power voltage VDD) on the bit line BL. A plurality of the SRAMs 500A of FIG. 7 can be arranged as an array, and one of the SRAMs 500A in columns of the array can be selected by the signals provided from the selecting line SEL, such that an array interleaving design can be achieved.

In operation 830, during the writing period, the transistor P4 is configured to be controlled with the signal provided by the data line D, to disconnect the power voltage VDD from the CMOS inverter C2. Since the power voltage VDD is disconnected from and the CMOS inverter C2, a current path between the PMOS transistor P2 of the CMOS inverter C2 and the transistor N4 is disconnected so as to prevent the write connection failure.

In operation 840, during a reading period, the transistor N5 is turned off according to the signal provided by the selecting line SEL for disconnecting the second terminal of the transistor N3 and the node S1, and the transistor N7 is turned on according to the signal provided the node S2 for discharging the bit line BL. Hereinafter, the transistor N7 discharging the bit line BL indicates that the voltage of the bit line BL is successfully pulled down through the transistor N7 to ground.

Figure 9:
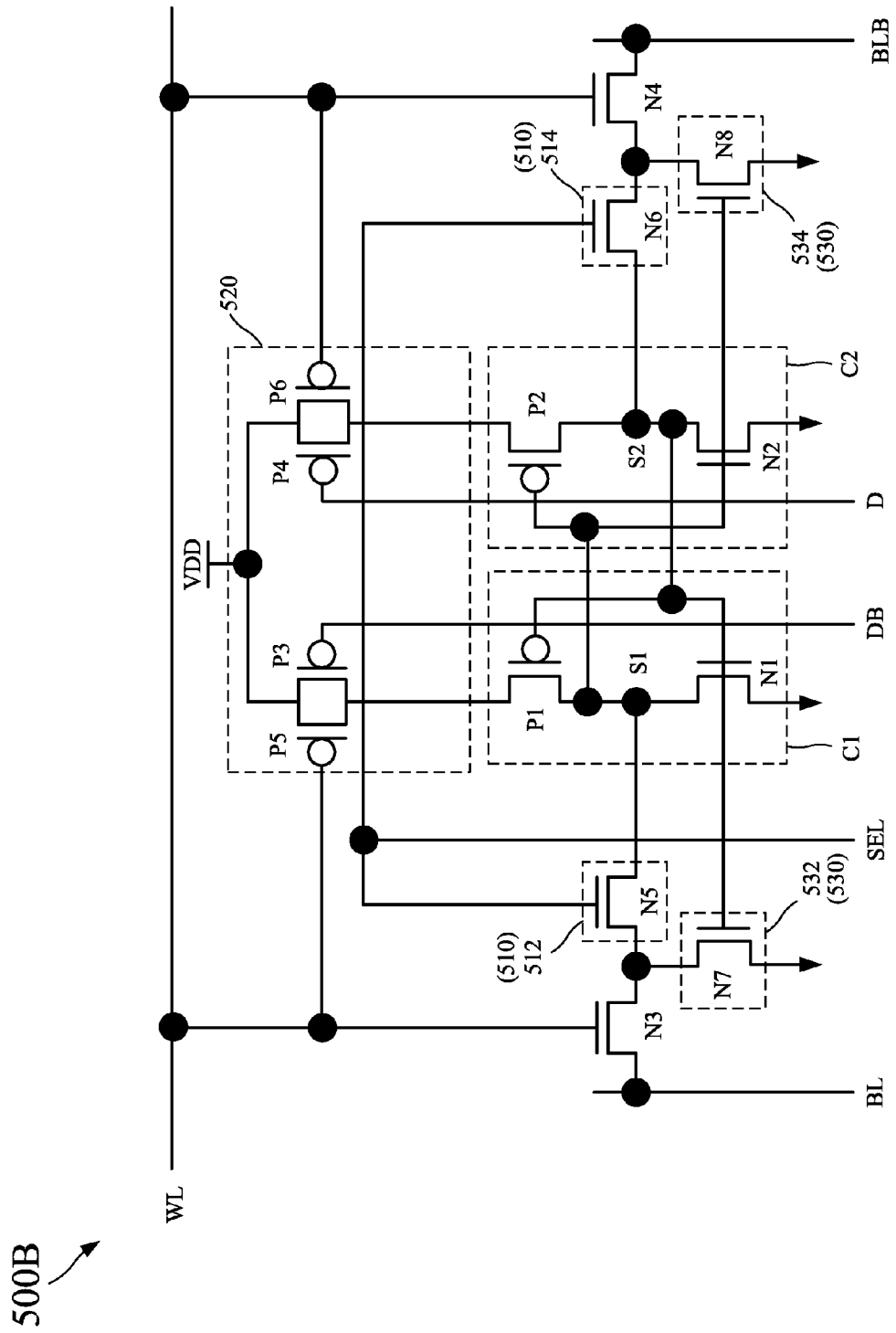
FIG. 9 is a schematic diagram of the SRAM as illustrated in FIG. 5 in accordance with some embodiments.

FIG. 9 is a schematic diagram of the SRAM as illustrated in FIG. 5 in accordance with some embodiments. Compared to the SRAM 500A in FIG. 7, the switching unit 520 in the SRAM 500B of FIG. 9 includes transistors P3-P6. Each of the transistors P3-P6 includes a first terminal, a second terminal, and a control terminal. The first terminals of the transistors P3-P6 are coupled to the power voltage VDD.

The second terminals of the transistors P3, P5 are coupled to the first terminal of the PMOS transistor P1. The second terminals of the transistors P4, P6 are coupled to the first terminal of the PMOS transistor P2. The control terminal of the transistor P3 is coupled to the first data line DB. The control terminal of the transistor P4 is coupled to the second data line D. The control terminals of the transistor P5, P6 are coupled to the word line WL.

Also disclosed is a memory device that includes a first inverter, a second inverter, an accessing unit, and a switching unit. The second inverter is cross-coupled with the first inverter. The accessing unit is configured to discharge an output of the first inverter and charge an output of the second inverter according to signals provided by a first word line and a second word line. The switching unit is configured to disconnect a power from the first inverter and the second inverter according to a signal provided by the first word line.

Also disclosed is a memory device that includes a first inverter, a second inverter, a first transistor, a second transistor, a first switching unit, a second switching unit, and a third switching unit. The second inverter is cross-coupled with the first inverter. The first transistor is coupled to a first bit line. The second transistor is coupled to a second bit line. The first switching unit is configured to discharge an output of the first inverter in response to a signal provided by the first bit line through the first transistor, and charge an output of the second inverter in response to a signal provided by the second bit line through the second transistor. The second switching unit is configured to disconnect a power from the first inverter and the second inverter according to signals provided by data lines. The third switching unit is configured to connect the second transistor to a reference voltage according to a signal provided by the output of the first inverter.

Also disclosed is a method that includes the operations below. During a writing operation, an output of a first inverter in a memory device is discharged according to a signal provided by a first word line, and an output of a second inverter in the memory device is charged according to a signal provided by a second word line, wherein the second inverter is cross-coupled with the first inverter. During the writing operation, a power is disconnected from the first inverter and the second inverter according to a signal provided by the first word line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device, comprising:
   a first inverter;
   a second inverter cross-coupled with the first inverter;
   an accessing unit configured to discharge an output of the first inverter and charge an output of the second inverter in response to signals provided by a first word line and a second word line; and a switching unit configured to disconnect a power from the first inverter and the second inverter in response to a signal provided by the first word line.

2. The memory device of claim 1, wherein phases of the signals provided by the first word line and the second word line are opposite.

3. The memory device of claim 1, wherein the accessing unit comprises:
   a first transmission gate configured to be controlled with the signals provided by the first word line and the second word line, to discharge the output of the first inverter in response to a signal provided by a first bit line; and
   a second transmission gate configured to be controlled with the signals provided by the first word line and the second word line, to charge the output of the second inverter in response to a signal provided by a second bit line.

4. The memory device of claim 3, wherein
   the first transmission gate comprises:
      an input coupled to the first bit line;
      an output coupled to the output of the first inverter;
      a first control terminal coupled to the first word line; and
      a second control terminal coupled to the second word line;
   wherein the second transmission gate comprises:
      an input coupled to the output of the second inverter;
      an output coupled to the second bit line;
      a first control terminal coupled to the first word line; and
      a second control terminal coupled to the second word line.

5. The memory device of claim 1, wherein the switching unit comprises:
   a first transistor configured to be controlled with the signal provided by the first word line, to disconnect the power from the first inverter; and
   a second transistor configured to be controlled with the signal provided by the first word line, to disconnect the power from the second inverter.

6. The memory device of claim 5, wherein
   the first transistor comprises:
      a first terminal configured to be coupled to the power;
      a second terminal coupled to the first inverter; and
      a control terminal coupled to the first word line;
   wherein the second transistor comprises:
      a first terminal configured to be coupled to the power;
      a second terminal coupled to the second inverter; and
      a control terminal coupled to the first word line.

7. The memory device of claim 1, further comprising:
   a reading unit configured to discharge a bit line according to signals provided by a third word line and the output of the first inverter.

8. The memory device of claim 7, wherein the accessing unit is configured to discharge the output of the first inverter and charge the output of the second inverter during a writing operation, the switching unit is configured to disconnect the power from the first inverter and the second inverter during the writing operation, and the reading unit is configured to discharge the bit line during a reading operation.

9. The memory device of claim 7, wherein the reading unit comprises
   a first transistor, comprising:
      a first terminal;
      a second terminal coupled to the bit line; and
      a control terminal coupled to the third word line; and
   a second transistor, comprising:
      a first terminal coupled to the first terminal of the first transistor;
      a second terminal configured to be coupled to ground; and
      a control terminal coupled to the output of the first inverter.

10. A memory device, comprising:
    a first inverter;
    a second inverter cross-coupled with the first inverter;
    a first transistor coupled to a first bit line;
    a second transistor coupled to a second bit line;
    a first switching unit, in response to a signal provided by a selecting line, configured to discharge an output of the first inverter by using a signal provided by the first bit line through the first transistor, and configured to charge an output of the second inverter by using a signal provided by the second bit line through the second transistor;
    a second switching unit configured to disconnect a power from the first inverter and the second inverter in response to signals provided by data lines; and
    a third switching unit configured to connect the second transistor to a reference voltage in response to a signal provided by the output of the first inverter.

11. The memory device of claim 10, wherein the first switching unit comprises:
    a third transistor configured to be controlled with the signal provided by the selecting line, to connect the first transistor with the output of the first inverter and discharge the output of the first inverter by using the signal provided by the first bit line through the first transistor; and
    a fourth transistor configured to be controlled with the signal provided by the selecting line, to connect the second transistor with the output of the second inverter and charge the output of the second inverter by using the signal provided by the second bit line through the second transistor.

12. The memory device of claim 11, wherein
    the third transistor comprises:
       a first terminal coupled to the first transistor;
       a second terminal coupled to the output of the first inverter; and
       a control terminal coupled to the selecting line;
    wherein the fourth transistor comprises:
       a first terminal coupled to the output of the second inverter;
       a second terminal coupled to the second transistor; and
       a control terminal coupled to the selecting line.

13. The memory device of claim 11, wherein the second switching unit comprises:
    a fifth transistor configured to be controlled with the signal provided by a first data line of the data lines, to disconnect the power from the first inverter; and
    a sixth transistor configured to be controlled with the signal provided by a second data line of the data lines, to disconnect the power from the second inverter.

14. The memory device of claim 13, wherein
    the fifth transistor comprises:
       a first terminal configured to be coupled to the power;
       a second terminal coupled to the first inverter; and
       a control terminal coupled to the first data line;
    wherein the sixth transistor comprises:
       a first terminal configured to be coupled to the power;
       a second terminal coupled to the second inverter; and
       a control terminal coupled to the second data line.

15. The memory device of claim 13, wherein the second switching unit further comprises:
    an equalizer configured to equalize voltages of the fifth transistor and the sixth transistor according to a signal provided by a word line.

16. The memory device of claim 13, wherein the second switching unit further comprises:
    a seventh transistor configured to be controlled with a signal provided by a word line, to disconnect the power from the first inverter; and
    an eighth transistor configured to be controlled with the signal provided by the word line, to disconnect the power from the second inverter.

17. The memory device of claim 16, wherein
    the seventh transistor comprises:
        a first terminal configured to be coupled to the power;
        a second terminal coupled to the first inverter; and
        a control terminal coupled to the word line;
    wherein the eighth transistor comprises:
        a first terminal configured to be coupled to the power;
        a second terminal coupled to the second inverter; and
        a control terminal coupled to the word line.

18. The memory device of claim 13, wherein the third switching unit comprises:
    a seventh transistor, comprising:
        a first terminal coupled to the first transistor;
        a second terminal configured to be coupled to ground; and
        a control terminal coupled to the output of the second inverter; and
    an eighth transistor, comprising:
        a first terminal coupled to the second transistor;
        a second terminal configured to be coupled to the reference voltage; and
        a control terminal coupled to the output of the first inverter.

19. A method, comprising:
    during a writing operation, discharging an output of a first inverter in a memory device in response to signals provided by a first word line and a second word line, and charging an output of a second inverter in the memory device in response to the signals provided by the first word line and the second word line, wherein the second inverter is cross-coupled with the first inverter; and
    during the writing operation, disconnecting a power from the first inverter and the second inverter in response to a signal provided by the first word line.

20. The method of claim 19, wherein the method further comprises:
    during a reading operation, discharging a bit line according to a signal provided by a third word line and the output of the first inverter.

* * * * *